US007011148B1

(12) United States Patent
Calanni et al.

(10) Patent No.: US 7,011,148 B1
(45) Date of Patent: Mar. 14, 2006

(54) HEAT EXCHANGER WITH INCREASED HEAT TRANSFER EFFICIENCY AND A LOW-COST METHOD OF FORMING THE HEAT EXCHANGER

(75) Inventors: Daniel J. Calanni, Plano, TX (US); Lawrence M. Giacoma, Plano, TX (US)

(73) Assignee: Tellabs Petaluma, Inc., Petaluma, CA (US)

( * ) Notice: Subject to any disclaimer, the term of this patent is extended or adjusted under 35 U.S.C. 154(b) by 72 days.

(21) Appl. No.: 10/692,393

(22) Filed: Oct. 23, 2003

(51) Int. Cl.
*F28D 9/00* (2006.01)

(52) U.S. Cl. ........................... 165/165; 165/DIG. 399; 29/890.03; 361/697

(58) Field of Classification Search ................ 165/104, 165/34, 165; 361/697
See application file for complete search history.

(56) References Cited

U.S. PATENT DOCUMENTS

| | | | | |
|---|---|---|---|---|
| 2,019,351 A | | 10/1935 | Lathrop | 257/245 |
| 3,559,728 A | | 2/1971 | Lyman | 165/55 |
| 3,829,945 A | | 8/1974 | Kanzler, et al. | 29/157.3 D |
| 4,040,804 A | | 8/1977 | Harrison | 55/158 |
| 4,254,827 A | | 3/1981 | Forster et al. | 165/166 |
| 4,384,611 A | | 5/1983 | Fung | 165/166 |
| 4,386,651 A | | 6/1983 | Reinhard | 165/104.33 |
| 4,739,827 A | * | 4/1988 | Onuki | 165/165 |
| 4,860,824 A | * | 8/1989 | Foley et al. | 165/165 |
| 6,059,023 A | | 5/2000 | Kurematsu | 165/165 |
| 6,247,526 B1 | * | 6/2001 | Okamoto et al. | 165/122 |
| 6,408,941 B1 | | 6/2002 | Zuo | 165/165 |
| 6,789,612 B1 | * | 9/2004 | Okamoto et al. | 165/104.34 |
| 2002/0170706 A1 | | 11/2002 | Hosokawa et al. | 165/164 |

FOREIGN PATENT DOCUMENTS

| | | | | |
|---|---|---|---|---|
| DE | 2231469 | | * | 3/1974 |
| DE | 25 46 450 | A1 | | 4/1976 |
| EP | 1 134 536 | A2 | | 9/2001 |
| EP | 1 251 325 | A2 | | 10/2002 |
| FR | 2 078 558 | A | | 11/1971 |
| GB | 1 498 621 | A | | 1/1978 |
| JP | 55118598 | A | * | 9/1980 |
| JP | 58145891 | A | | 8/1983 |

OTHER PUBLICATIONS

U.S. appl. No. 10/606,452, filed Jun. 26, 2003, inventor Giacoma et al.

* cited by examiner

*Primary Examiner*—Allen J. Flanigan
(74) *Attorney, Agent, or Firm*—Mark C. Pickering

(57) ABSTRACT

The efficiency of a heat exchanger is significantly improved by connecting walls to an air flow structure, which has first grooves formed in the top surface of the structure and second grooves formed in the bottom surface of the structure, that block off alternating ends of the first and second grooves such that a first air source can only flow through the first grooves and a second air source can only flow through the second grooves.

19 Claims, 9 Drawing Sheets

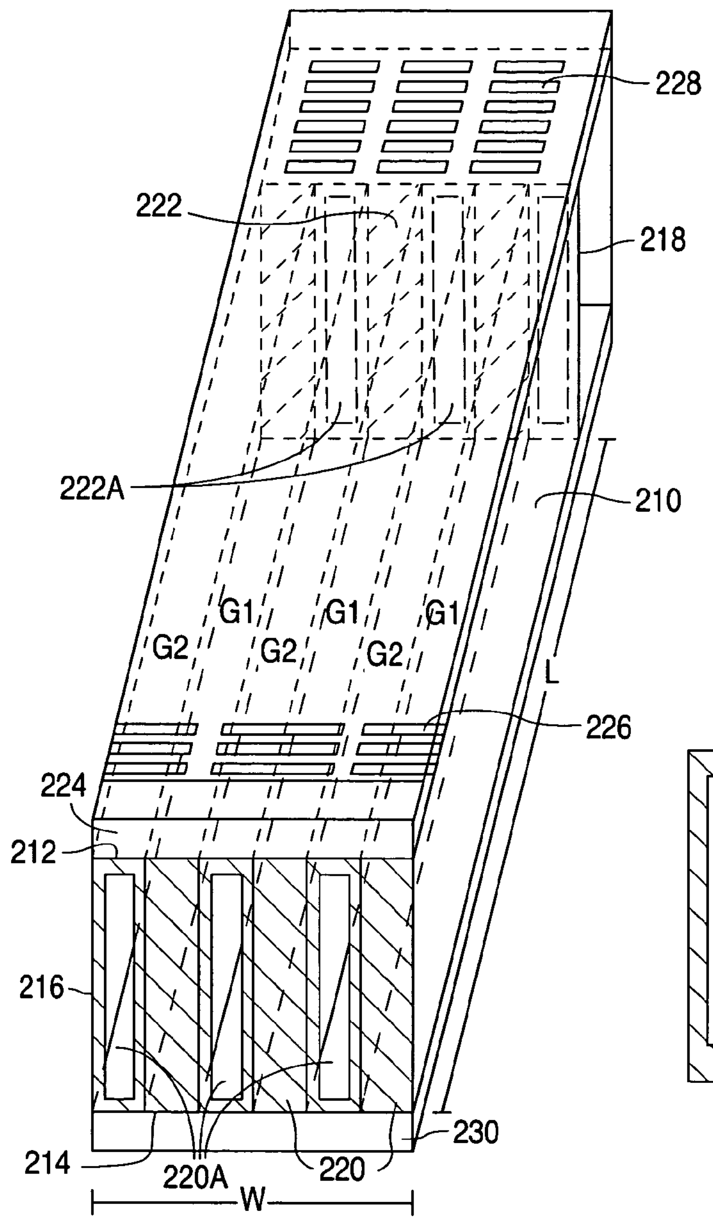
FIG. 2F
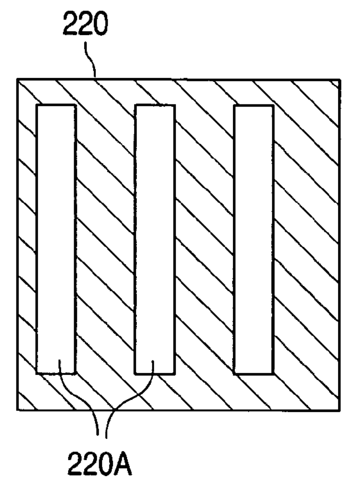
FIG. 4A
FIG. 4B
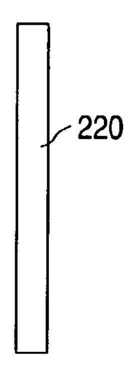

HEAT EXCHANGER WITH INCREASED HEAT TRANSFER EFFICIENCY AND A LOW-COST METHOD OF FORMING THE HEAT EXCHANGER

BACKGROUND OF THE INVENTION

1. Field of the Invention

The present invention relates to heat exchangers and, more particularly, to a heat exchanger with an increased heat transfer efficiency and a low-cost method of forming the heat exchanger.

2. Description of the Related Art

Telecommunications equipment is commonly housed in electronics cabinets that sit outside in residential and commercial neighborhoods. The cabinets are water tight and air tight to prevent water and dust from entering the cabinets and reducing the useful life of the equipment inside the cabinets.

When operating as intended, the telecommunications equipment produces heat which can damage the equipment when the heat inside the cabinet exceeds a predetermined temperature. To maintain an air tight enclosure and prevent the temperature from exceeding the predetermined temperature, electronics cabinets often use air-to-air heat exchangers.

FIGS. 1A–1C show views that illustrate a prior art air-to-air heat exchanger 100. FIG. 1A is a top plan view, FIG. 1B is a right side view, and FIG. 1C is a bottom plan view. As shown in FIGS. 1A–1C, heat exchanger 100 includes an air flow structure 110 that directs the flow of external and internal air through heat exchanger 100.

FIGS. 1D–1E show views that further illustrate air flow structure 110. FIG. 1D is a partial perspective view, and FIG. 1E is a partial plan view. As shown in FIGS. 1A–1E, air flow structure 110 has a top surface 112 and a bottom surface 114. In addition, structure 110 has a width W, a length L, a first end 116 that runs along the width W, and a second end 118 that runs along the width W.

In addition, air flow structure 110 includes a number of first grooves G1 that are formed in the top surface 112, and a number of second grooves G2 that are formed in the bottom surface 114. As shown, the first and second grooves G1 and G2 extend along the length L between the first and second ends 116 and 118.

Heat exchanger 100 also includes a number of first crimped ends 120 that close alternate ends of the second grooves G2 along the first end 116, and a number of second crimped ends 122 that close alternate ends of the first grooves G1 along the second end 118. In addition, a caulked region 123 is formed around each of the first and second crimped ends 120 and 122 to form an air tight seal.

As further shown in FIGS. 1A–1C, heat exchanger 100 also includes a first plate 124 that is formed adjacent to the top surface 112 of air flow structure 110. In the example, first plate 124 contacts the top surface 112, the first crimped ends 120, the second crimped ends 122, and the caulked regions 123 to form an air tight connection. In addition, first plate 124 has an external air inlet opening 126, and an external air exit opening 128. Opening 126 exposes a region adjacent to air flow structure 110, while opening 128 exposes the second grooves G2 of air flow structure 110.

Heat exchanger 100 further includes a second plate 130 that is formed adjacent to the bottom surface of 114 air flow structure 110. In the example, second plate 130 contacts the bottom surface 114, the first crimped ends 120, the second crimped ends 122, and the caulked regions 123 to form an air tight connection. Further, second plate 130 includes a base section 130A and sidewalls 130B that extend perpendicularly away from base section 130A to form an enclosure. The enclosure formed by base section 130A and sidewalls 130B is connected to first plate 124 to form an air tight connection.

Second plate 130 also has an internal air inlet opening 132, and an internal air exit opening 134. Opening 132 exposes a region adjacent to air flow structure 110, while opening 134 exposes the first grooves G1 of air flow structure 110.

As further shown in FIGS. 1A–1C, heat exchanger 100 includes an air flow generator 140, such as an axial fan, that is connected to first plate 124 adjacent to opening 126. Air flow generator 140 causes external air to follow a path 142 in through opening 126, along the second grooves G2, and out through opening 128.

Heat exchanger 100 additionally includes an air flow generator 144, such as an axial fan, that is connected to second plate 130 adjacent to opening 132. Air flow generator 144 causes internal air to follow a path 146 in through opening 132, along the first grooves G1, and out through opening 134.

In operation, a stream of internal cabinet air circulates through the telecommunications equipment, through opening 132 in second plate 130, and through the grooves G1. The stream of internal cabinet air continues through openings 134 in second plate 130 and back through the telecommunications equipment. As the internal cabinet air circulates, the internal cabinet air transfers heat to the skin of air flow structure 110.

At the same time, a stream of external air is pulled in from the outside through opening 126, and through grooves G2. The stream of external air continues through opening 128 and is exhausted without mixing with the internal cabinet air. The external air, which is cooler than the internal cabinet air, absorbs heat from the skin of air flow structure 110, thereby effecting a transfer of heat from the internal cabinet air to the external air.

One trend in the telecommunications industry is to make line replaceable cards such that, for example, a card that supports plain old telephone service (POTS) can be replaced with a card that supports both POTS and xDSL broadband data service. Replacement cards which provide more than basic POTS service, however, tend to generate more heat than basic POTS cards.

One problem with heat exchanger 100 is that it is difficult to increase the efficiency by which heat is transferred out of the cabinet. Thus, when a telecommunications cabinet is at or near its maximum heat capacity, it is difficult to replace basic POTS cards with cards that provide a wider variety of services without exceeding the maximum heat capacity of the cabinet.

One reason that it is difficult to increase the efficiency of heat exchanger 100 is that it is difficult to increase the number of grooves G1 and G2 per 2.54 centimeters (inch) beyond about two grooves per 2.54 centimeters (inch). FIGS. 1F–1H show perspective drawings that illustrate the fabrication of air flow structure 110.

As shown in FIG. 1F, to fabricate air flow structure 110, a corrugated air flow structure 150 is formed using conventional techniques. Next, as shown in FIG. 1G, alternate ends of air flow structure 150 are crimped to form crimped ends 120 and 122. The first and second plates 124 and 130 are attached to air flow structure 150. To prevent the internal cabinet air from mixing with the external air, the crimped ends 120 and 122 between the first and second plates 124 and 130 must be sealed. As shown in FIG. 1H, this is typically accomplished by hand applying a caulking material to the crimped ends 120 and 122 to form caulked regions 123.

However, to apply the caulking material, a significant amount of space is required to provide the access needed by the caulking gun. In addition, once the caulked regions 123 have been formed, the lateral spacing X between adjacent caulked regions 123 is relatively small. Thus, the small lateral space X between adjacent caulked regions 123 limits the number of grooves G1 and G2 that are available to approximately two per 2.54 centimeters (inch).

Heat exchanger 100 is also relatively expensive to fabricate. One reason for this is that the caulking material that is applied to the crimped ends 120 and 122 and the first and second plates 124 and 130 to formed caulked regions 123 is typically applied by hand. This, in turn, is a time consuming and expensive process. Thus, there is a need for a more efficient and less costly heat exchanger.

SUMMARY OF THE INVENTION

The present invention provides a more efficient heat exchanger that is less costly to fabricate. A heat exchanger in an embodiment of the present invention includes an air flow structure that has a top surface, a bottom surface, a width, a length, a first edge that runs along the width, and a second edge that runs along the width. In addition, the air flow structure includes a plurality of first grooves in the top surface, and a plurality of second grooves in the bottom surface. The first and second grooves extend along the length between the first and second edges. Further, the heat exchanger also includes a first wall that contacts substantially all of the first edge of the air flow structure. The first wall has a plurality of openings that extend through the first wall such that each opening is surrounded by the first wall. No portion of the first wall extends into the plurality of first grooves. The first wall prevents a fluid in the first grooves from flowing past the first edge, while the plurality of openings allow a fluid in the second grooves to flow past the first edge. The heat exchanger additionally includes a second wall that contacts substantially all of the second edge of the air flow structure. The second wall has a plurality of openings that extend through the second wall such that each opening in the second wall is surrounded by the second wall. No portion of the second wall extends into the plurality of first grooves. The second wall prevents a fluid in the second grooves from flowing past the second edge, while the plurality of openings in the second wall allow a fluid in the first grooves to flow past the second edge.

An embodiment of the present invention also includes a method of forming a heat exchanger. The method includes an air flow structure that has a top surface, a bottom surface, a width, a length, a first edge that runs along the width, and a second edge that runs along the width. In addition, the air flow structure includes a plurality of first grooves in the top surface, and a plurality of second grooves in the bottom surface. The first and second grooves extend along the length between the first and second edges. The method also includes forming a first wall, forming a first wall that contacts substantially all of the first edge of the air flow structure. The first wall has a plurality of openings that extend through the first wall such that each opening is surrounded by the first wall. No portion of the first wall extends into the plurality of first grooves. The first wall prevents a fluid in the first grooves from flowing past the first edge, while the plurality of openings allow a fluid in the second grooves to flow past the first edge. The method further includes connecting the first wall to the first edge of the air flow structure.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 1A is a top plan view, FIG. 1B is a right side view, and FIG. 1C is a bottom plan view. FIG. 1D is a partial perspective view, and FIG. 1E is a partial plan view. FIGS. 1F–1H are perspective drawings illustrating the fabrication of air flow structure 110.

FIGS. 2A–2F are a series of views illustrating an example of a heat exchanger 200 in accordance with the present invention. FIG. 2A is a front side perspective view, while FIG. 2B is a back side perspective view. FIG. 2C is a top plan view taken between lines 2C1—2C1 and 2C2–2C2 of FIG. 2A, FIG. 2D is a right side view taken along lines 2D—2D of FIG. 2C, and FIG. 2E is a bottom plan view taken between lines 2E1—2E1 and 2E2—2E2 of FIG. 2B. FIG. 2F is a perspective view of FIG. 2C taken along lines 2F—2F of FIG. 2C.

FIG. 3A is a perspective view, while FIG. 3B is an end view.

FIGS. 4A–4B are views more clearly illustrating first wall 220 in accordance with the present invention.

DETAILED DESCRIPTION OF THE INVENTION

Figure 1A:
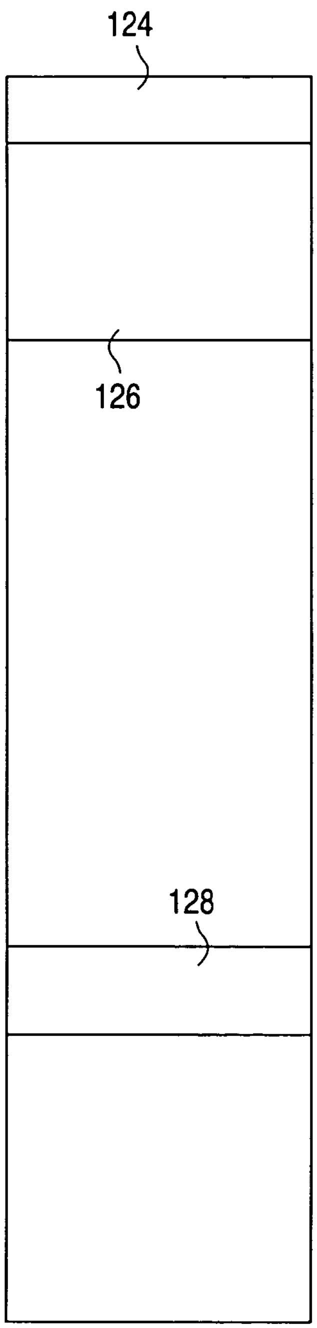
FIGS. 1A–1H are a series of views illustrating a prior art air-to-air heat exchanger 100.
Figure 1B:
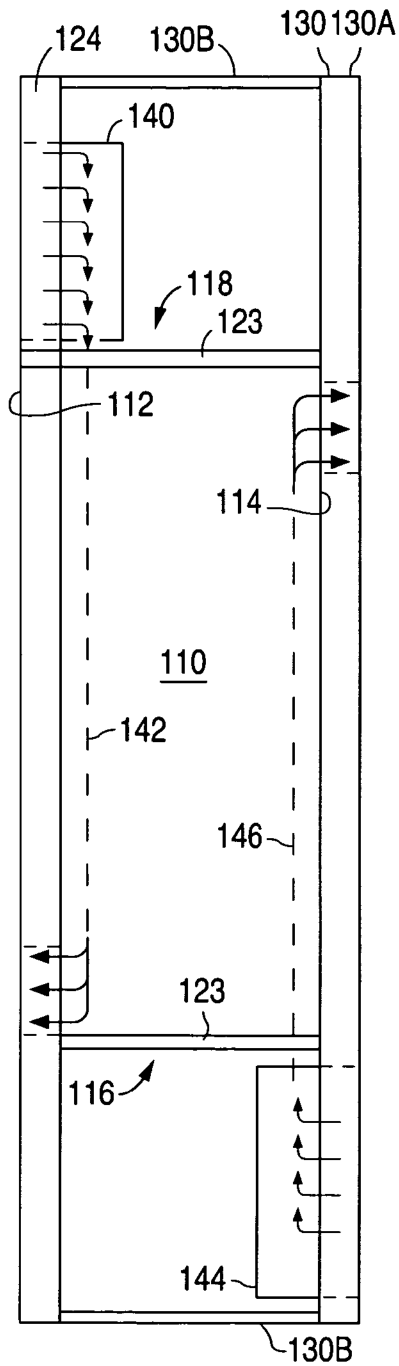
Figure 1C:
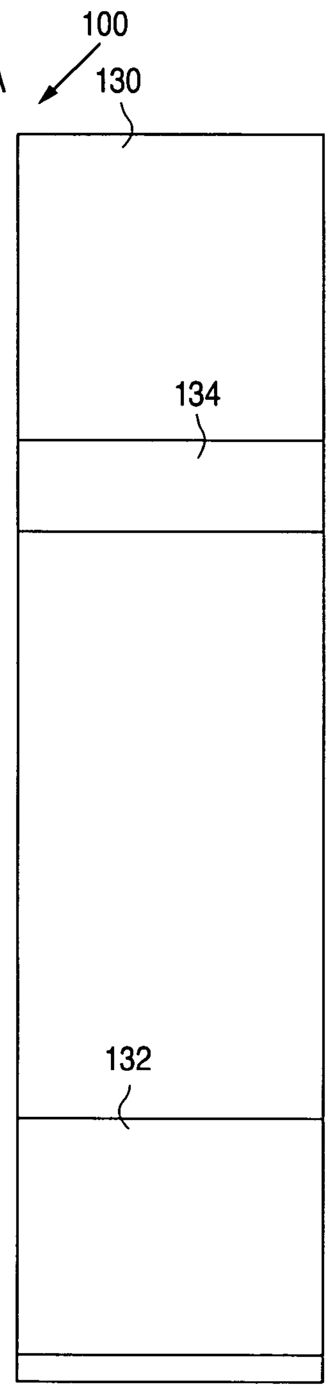
Figure 1D:
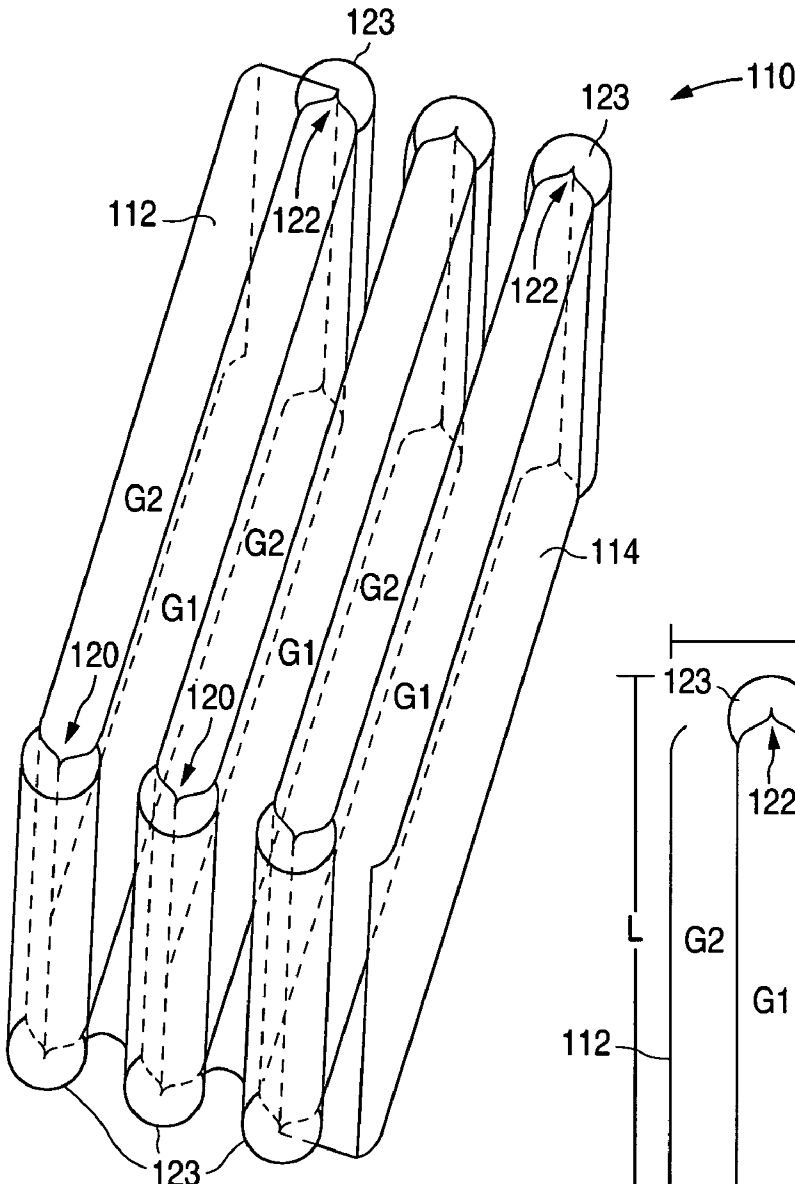
Figure 1E:
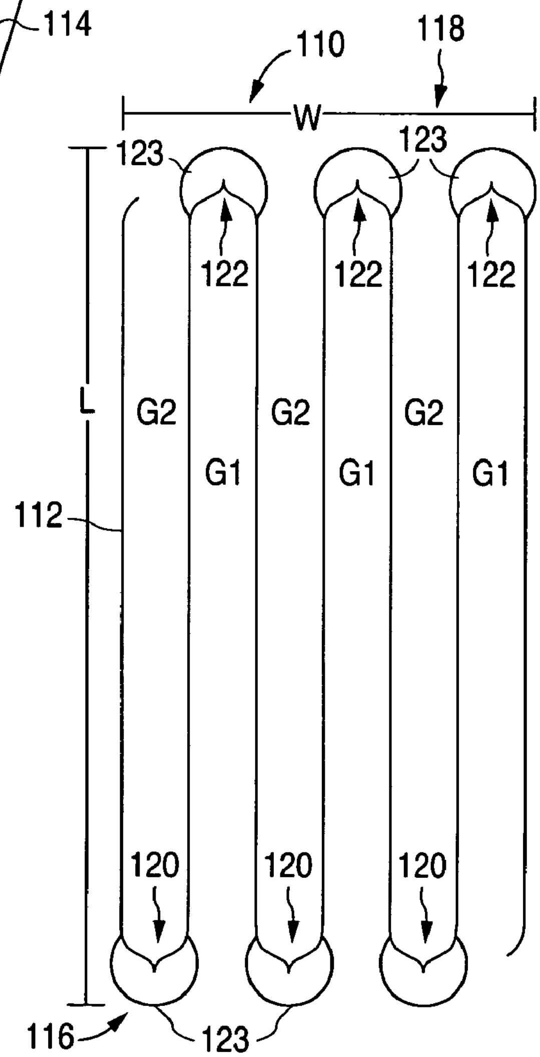
Figure 1F:
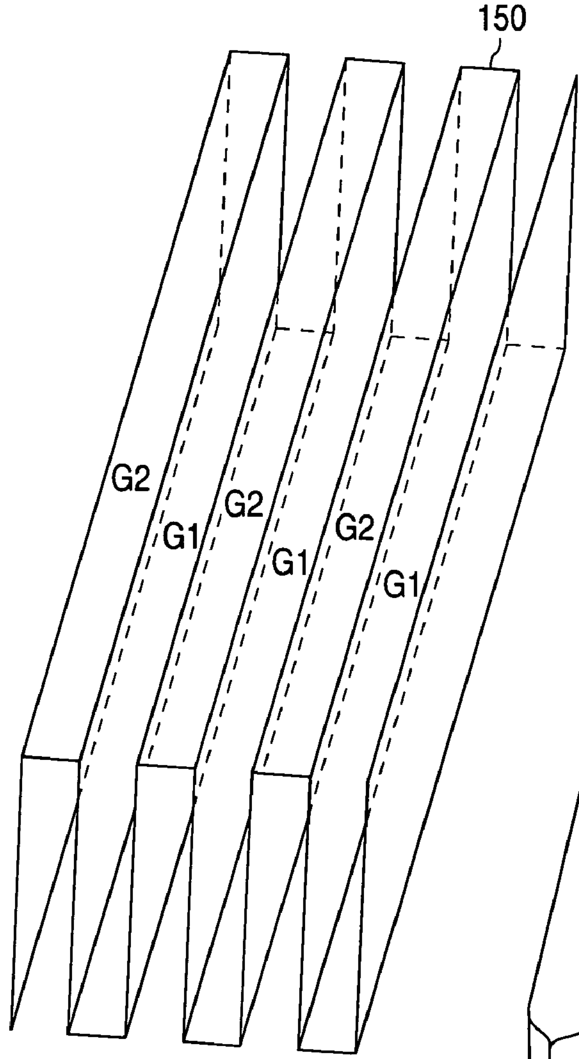
Figure 1G:
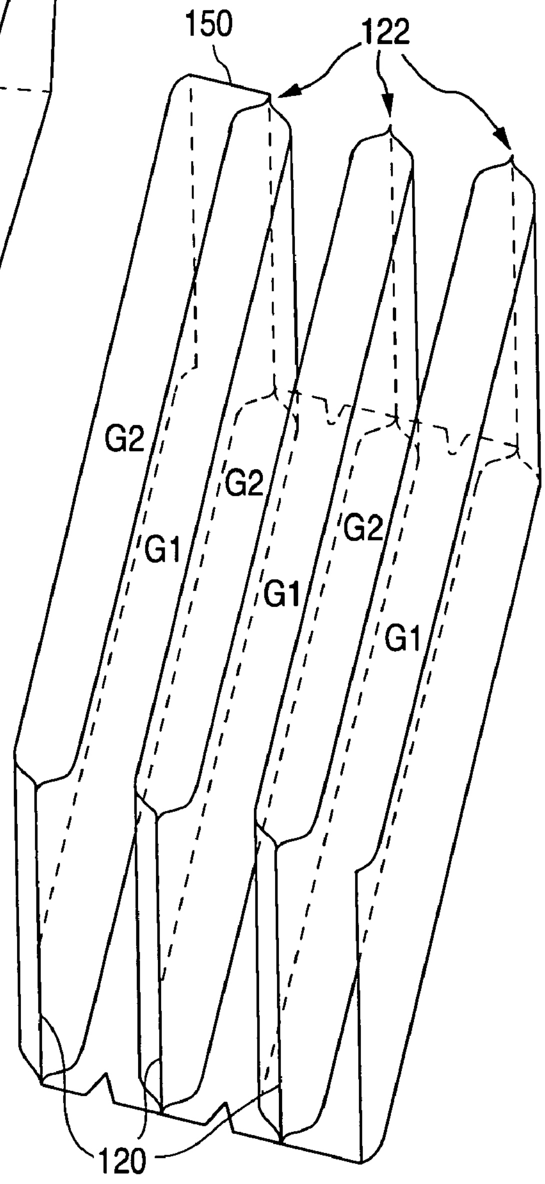
Figure 1H:
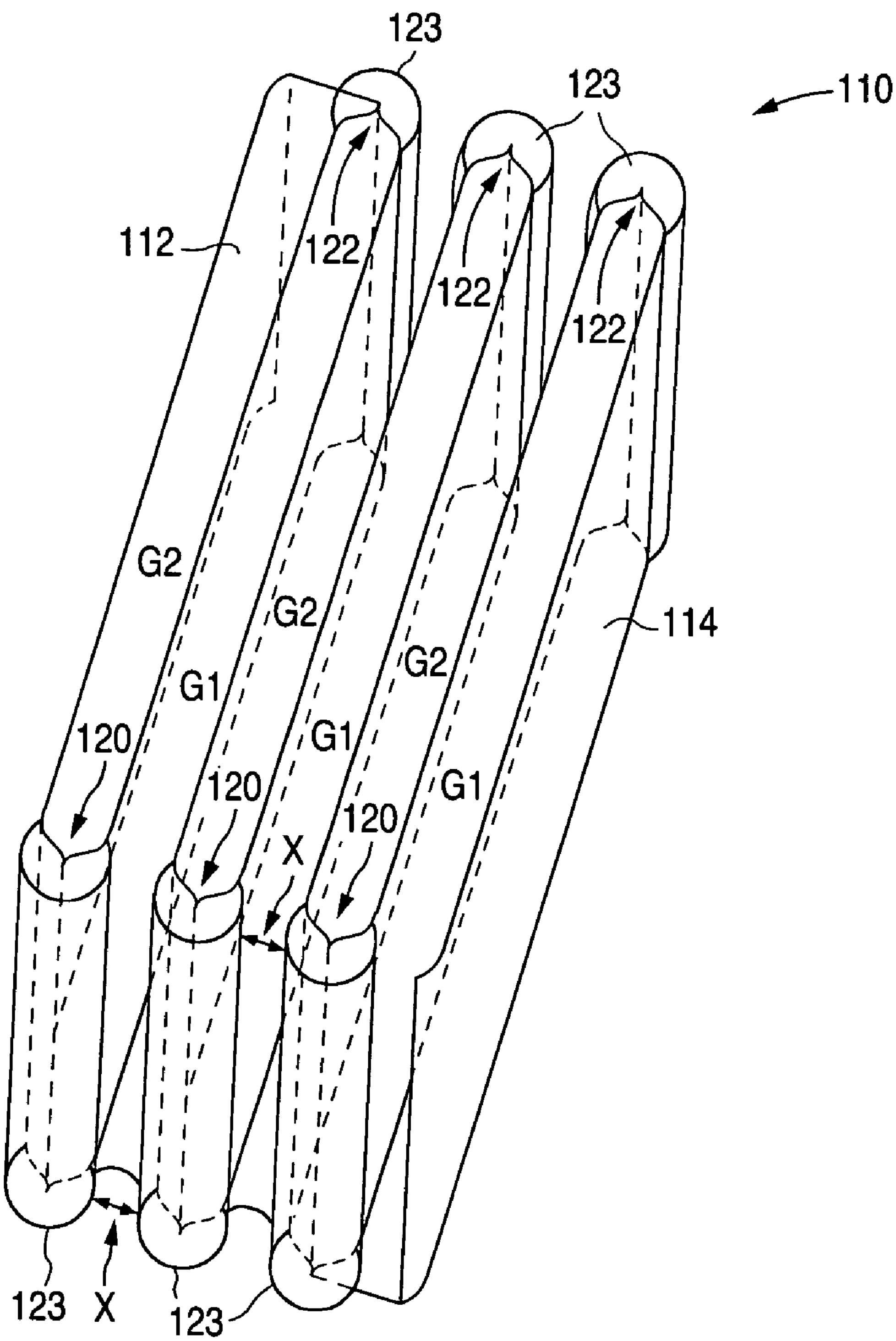
Figure 2A:
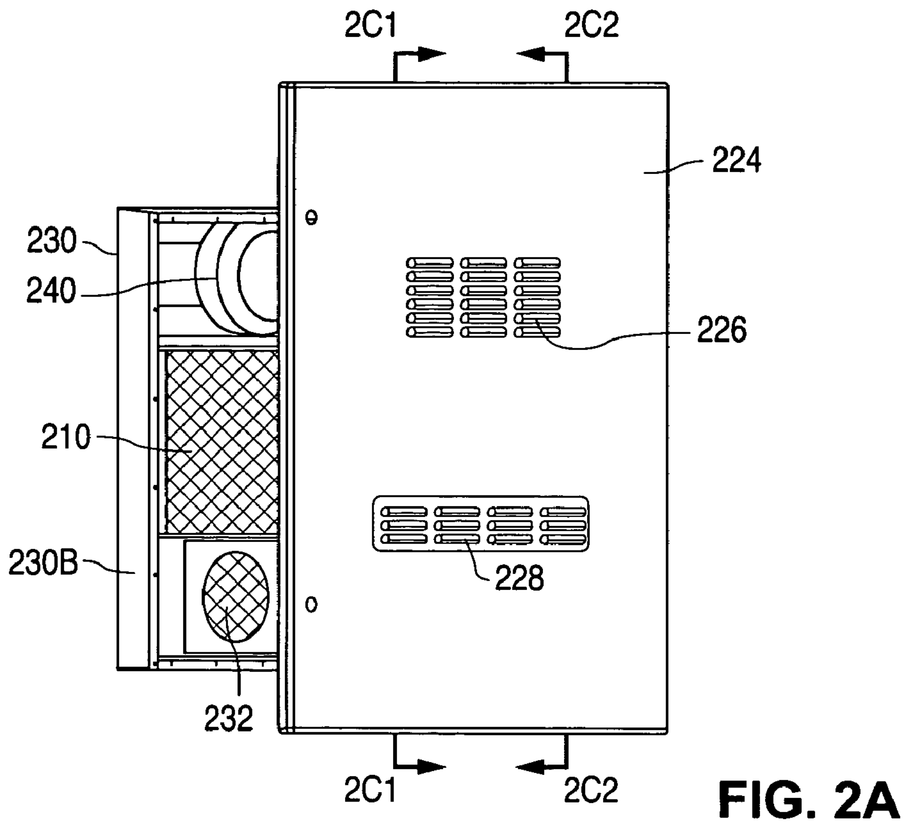
Figure 2B:
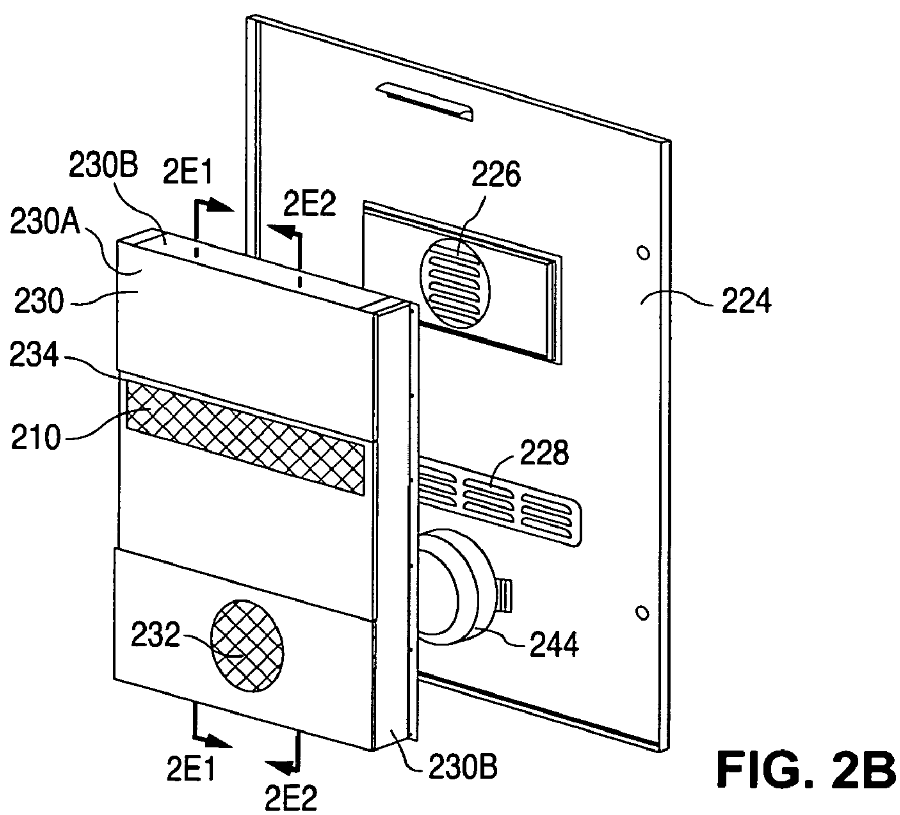
Figure 2C:
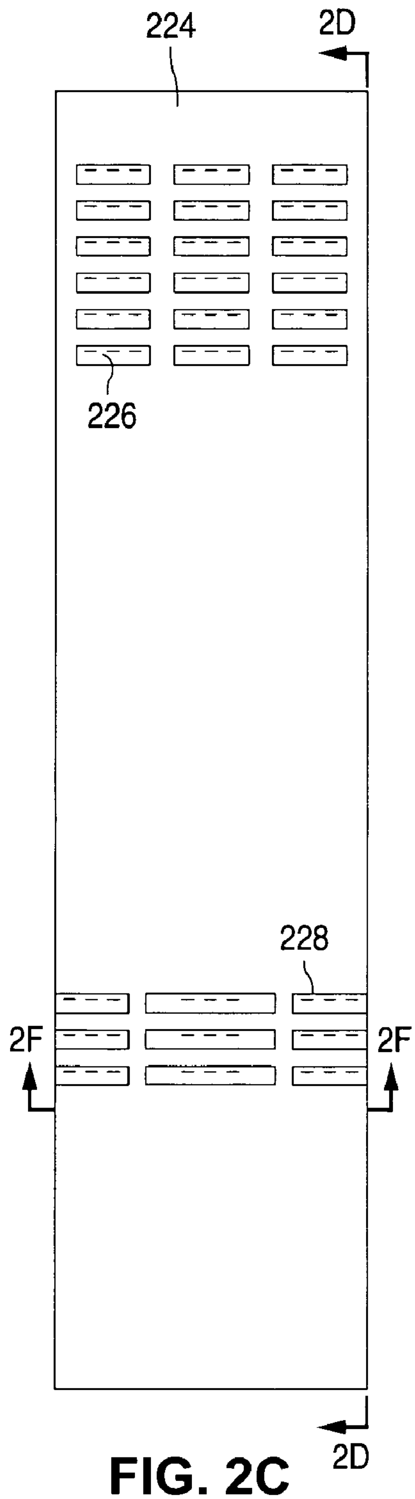
Figure 2D:
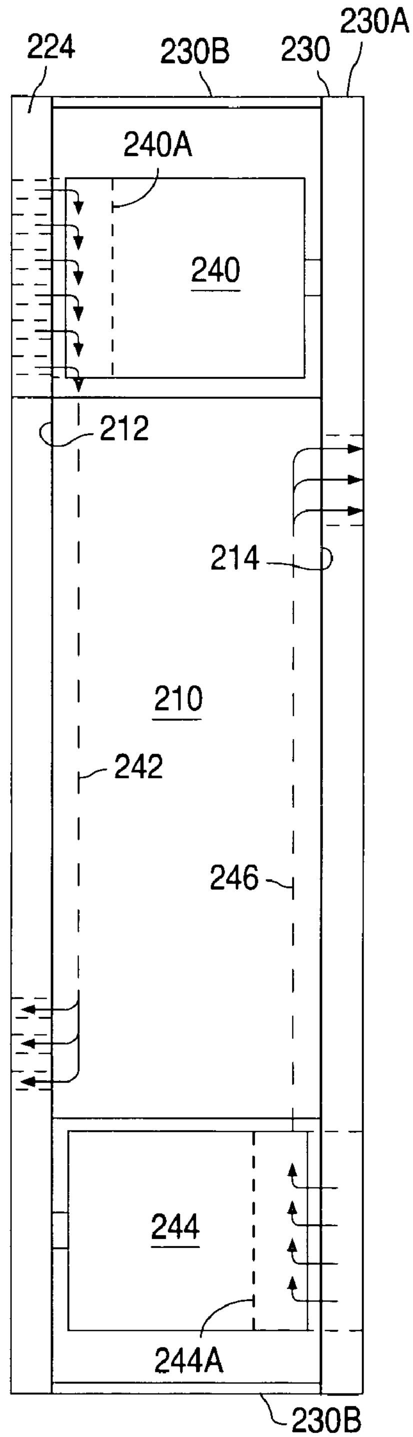
Figure 2E:
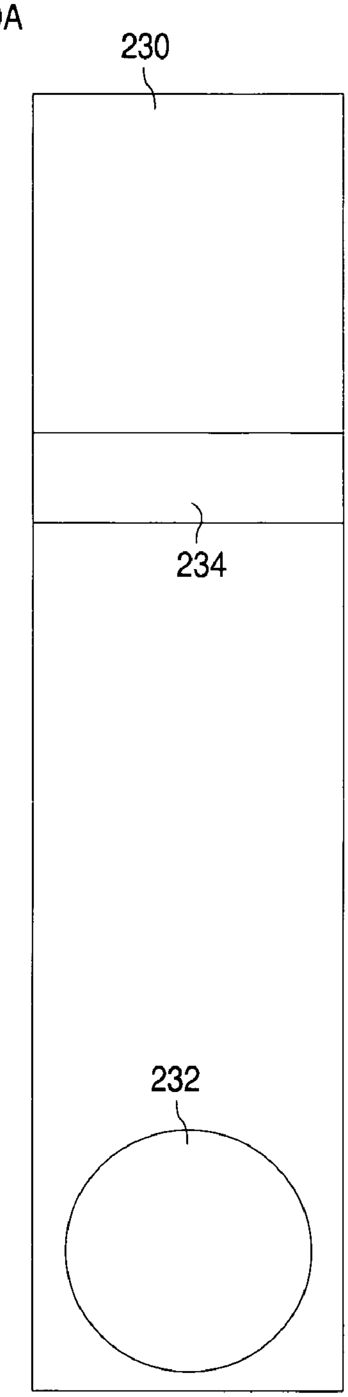

FIGS. 2A–2F show a series of views that illustrate an example of a heat exchanger 200 in accordance with the present invention. FIG. 2A shows a front side perspective view, while FIG. 2B shows a back side perspective view. FIG. 2C shows a top plan view taken between lines 2C1—2C1 and 2C2—2C2 of FIG. 2A, FIG. 2D shows a right side view taken along lines 2D—2D of FIG. 2C, and FIG. 2E shows a bottom plan view taken between lines 2E1—2E1 and 2E2—2E2 of FIG. 2B. FIG. 2F shows a perspective view of FIG. 2C taken along lines 2F—2F of FIG. 2C.

As shown in FIGS. 2A–2F, heat exchanger 200 includes an air flow structure 210 that directs the flow of external and internal air through heat exchanger 200. Air flow structure 210, in turn, has a top surface 212 and a bottom surface 214. In addition, structure 200 has a width W, a length L, a first edge 216 that runs along the width W, and a second edge 218 that runs along the width W.

Further, air flow structure 210 includes a number of first grooves G1 that are formed in the top surface 212, and a number of second grooves G2 that are formed in the bottom surface 214. As shown, the first and second grooves G1 and G2 extend along the length L between the first and second edges 216 and 218.

Figure 3A:
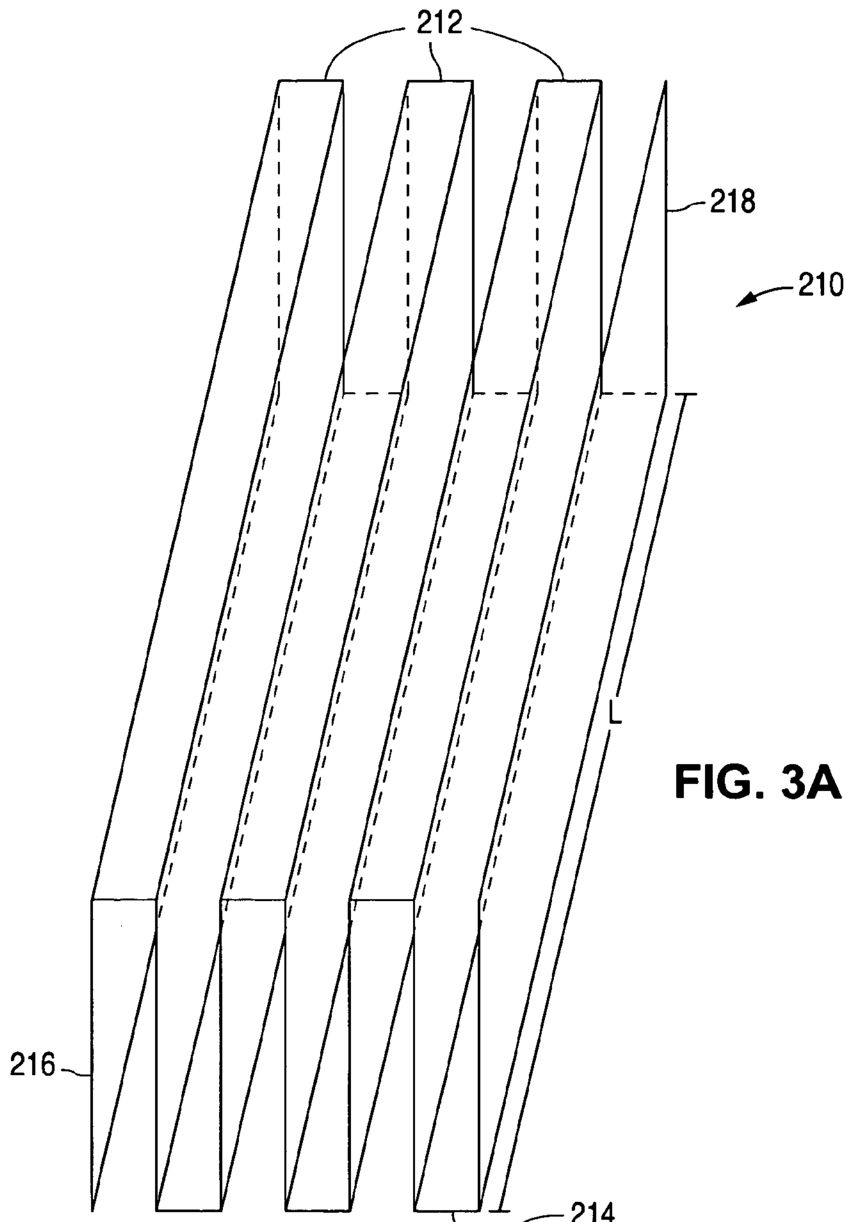
FIGS. 3A–3B are views more clearly illustrating air flow structure 210 in accordance with the present invention.
Figure 3B:
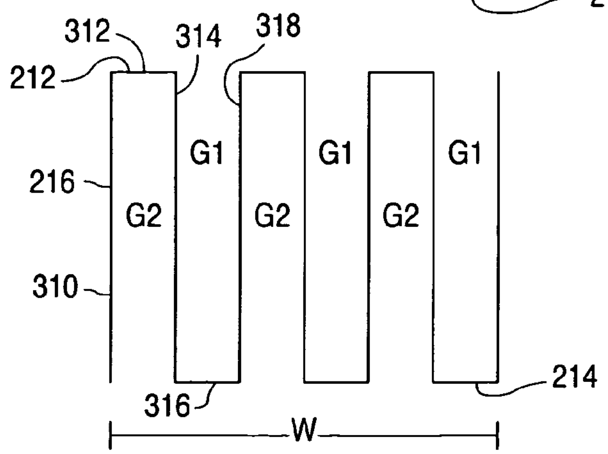

FIGS. 3A–3B show views that more clearly illustrate air flow structure 210 in accordance with the present invention. FIG. 3A shows a perspective view, while FIG. 3B shows an end view. As noted above, air flow structure 210 has a top surface 212, a bottom surface 214, a width W, a length L, a first edge 216, and a second edge 218.

As further noted above, structure 210 also has a number of first grooves G1 that are formed in the top surface 212, and a number of second grooves G2 that are formed in the bottom surface 214. The first and second grooves G1 and G2 extend along the length L between the first and second edges 216 and 218. In the present example, each groove G1 and G2 has a substantially uniform width from the first edge 216 to the second edge 218.

As shown in FIGS. 3A–3B, air flow structure 210 forms the first and second grooves G1 and G2 by running vertically to form a vertical side 310, turning and running horizontally away from side 310 to form a top side 312, and turning and running vertically away from side 312 to form a vertical side 314 that is substantially parallel with vertical side 310.

As further shown in FIGS. 3A–3B, structure 210 continues by running horizontally away from sides 310 and 314 to form a bottom side 316, and turning and running vertically away from side 316 to form a vertical side 318 that is substantially parallel with vertical sides 310 and 314. The remainder of structure 210 is formed by continuing this same pattern. Thus, in the example shown in FIGS. 3A–3B, each adjacent first and second groove G1 and G2 share a section of the air flow structure.

Although air flow structure 210 forms the first and second grooves G1 and G2 with a corrugated shape, other shapes can alternately be used. For example, from an end view, air flow structure 210 can have a saw-tooth shape, a saw-tooth shape with flattened peaks and valleys, or a sinusoidal shape. In addition, air flow structure 210 can be formed from metal, such as aluminum, or other heat conducting materials.

Referring again to FIGS. 2A–2F, heat exchanger 200 also includes a first wall 220 that is connected to first edge 216 of air flow structure 210, and a second wall 222 that is connected to second edge 218 of air flow structure 210. First and second walls 220 and 222, in turn, both have a number of openings 220A and 222A, respectively.

FIGS. 4A–4B show views that more clearly illustrate first wall 220 in accordance with the present invention. As shown in FIG. 4A, which shows a plan view, first wall 220 includes a number of spaced apart openings 220A. As shown in FIG. 4B, which shows an end view, first wall 220 is relatively thin.

First and second walls 220 and 222 are identical except that, when walls 220 and 222 are connected to air flow structure 210, an opening in first wall 210 corresponds to a closed section of second wall 222, while a closed section of first wall 210 corresponds to an opening in second wall 222.

Referring again to FIGS. 2A–2F, heat exchanger 200 also includes a first plate 224 that is formed adjacent to the top surface 212 of air flow structure 210. In the example shown in FIGS. 2A–2F, first plate 224 contacts the top surface 212, first wall 220, and second wall 222 to form an air tight connection.

In addition, first plate 224 has a plurality of openings 226 that form an external air inlet, and a plurality of openings 228 that form an external air exit. Openings 226 expose a region adjacent to air flow structure 210, while openings 228 expose the first grooves G1 of air flow structure 210. (A single opening can alternately be used in lieu of openings 226, and a single opening can alternately be used in lieu of openings 228.)

Heat exchanger 200 further includes a second plate 230 that is formed adjacent to the bottom surface of 214 air flow structure 210. In the example shown in FIGS. 2A–2F, second plate 230 contacts the bottom surface 214, first wall 220, and second wall 222 to form an air tight connection. Further, second plate 230 includes a base section 230A and sidewalls 230B that extend perpendicularly away from base section 230A to form an enclosure. The enclosure formed by base section 230A and sidewalls 230B is connected to first plate 224 to form an air tight connection.

Second plate 230 also has an opening 232 that forms an internal air inlet, and an opening 234 that forms an internal air exit. Opening 232 exposes a region adjacent to air flow structure 210, while opening 234 exposes the second grooves G2 of air flow structure 210. (A plurality of openings can alternately be used instead of opening 232, and a plurality of openings can alternately be used instead of opening 234.)

As further shown in FIGS. 2A–2F, heat exchanger 200 includes an air flow generator 240, such as a radial fan, that is connected to second plate 230 adjacent to openings 226. Air flow generator 240 causes external air to follow a path 242 in through openings 226, along the first grooves G1, and out through openings 228. (In FIG. 2D, path 242 is shown near the surface of plate 224 only for purposes of illustration. Air flow generator 240 is sized appropriately to pull external air down towards the bottom of the grooves G1 for maximum heat transfer.)

Although air flow generator 240 is shown connected to second plate 230, generator 240 can alternately be connected to first plate 224 as shown by dashed lines 240A. In addition, generator 240 can be reversed to pull external air in through openings 228 and along through the first grooves G1 where the air exits through openings 226.

Heat exchanger 200 additionally includes an air flow generator 244, such as a radial fan, that is connected to first plate 224 adjacent to opening 232. Air flow generator 244 causes internal air to follow a path 246 in through opening 232, along the second grooves G2, and out through opening 234. (In FIG. 2D, path 246 is shown near the surface of plate 230 only for purposes of illustration. Air flow generator 244 is sized appropriately to pull internal air down towards the bottom of the grooves G2 for maximum heat transfer.)

Although air flow generator 244 is shown connected to first plate 244, generator 244 can alternately be connected to second plate 230 as shown by dashed lines 244A. In addition, generator 244 can be reversed to pull the internal air in through opening 234 and along through the second grooves G2, and push the internal air out through opening 232.

To fabricate heat exchanger 200, the above-described elements are fabricated and then assembled. Air flow structure 210 is formed using conventional techniques. Walls 220 and 222 are formed using, for example, plastic injection molding, metal stampings, or other material that can be similarly formed and attached to air flow structure 210.

Once formed, the first and second walls 220 and 222 can be connected to air flow structure 210 by applying an adhesive to the walls 220 and 222, and then placing the first and second walls 220 and 222 in contact with the first and second edges 216 and 218 of air flow structure 210.

Once first plate 224 has been fabricated, including the formation of openings 226 and 228, and second plate 230 has been fabricated, including the formation of openings 232 and 234, air flow generators 240 and 244 are connected to second and first plates 230 and 224, respectively.

Following this, air flow structure 210, including walls 220 and 222, is attached to second plate 230 using conventional adhesives. This structure is then attached to first plate 224 using conventional adhesives to form heat exchanger 200 as an air tight unit such that external air can only flow through openings 226 and 228, and internal air can only flow through openings 232 and 234.

External power cords, which provide power to air flow generators 240 and 244, can be routed out through the unit and sealed in a conventional manner. In addition, less thermal stress can be obtained if the materials used to fabricate air flow structure 210, first plate 224, and second plate 230 have similar thermal coefficients. (Although one method of assembling the elements has been described, heat exchanger 200 can alternately be formed by altering the order of assembly.)

One of the advantages of the present invention is that air flow structure 210 can be easily manufactured to have any number of grooves per 2.54 centimeters (inch), thereby significantly improving the heat transfer efficiency. By increasing the number of grooves per 2.54 centimeters (inch), the efficiency of the heat exchanger can be increased to an optimum point. Experimental results have shown that using six grooves per 2.54 centimeters (inch) (with a fixed air velocity) increases the heat transfer efficiency of the heat exchanger by approximately 50%.

Another advantage of the present invention is that the method of forming the first and second walls 220 and 222, and connecting the walls 220 and 222 to air flow structure 210 is significantly less expensive than prior art fabrication techniques which require that individual crimped ends be sealed or caulked by hand. In the present invention, the walls 220 and 222 are easily formed and adhesively connected. Thus, the heat exchanger of the present invention provides fabrication cost advantages as well.

Another advantage of the present invention is that heat exchanger 200 can be easily fabricated as part of a door or access panel of a telecommunications cabinet. This increases the ease of fabrication of the cabinet, ease of replacement of a failed heat exchanger, and ease of upgrade of existing cabinets.

Figure 5:
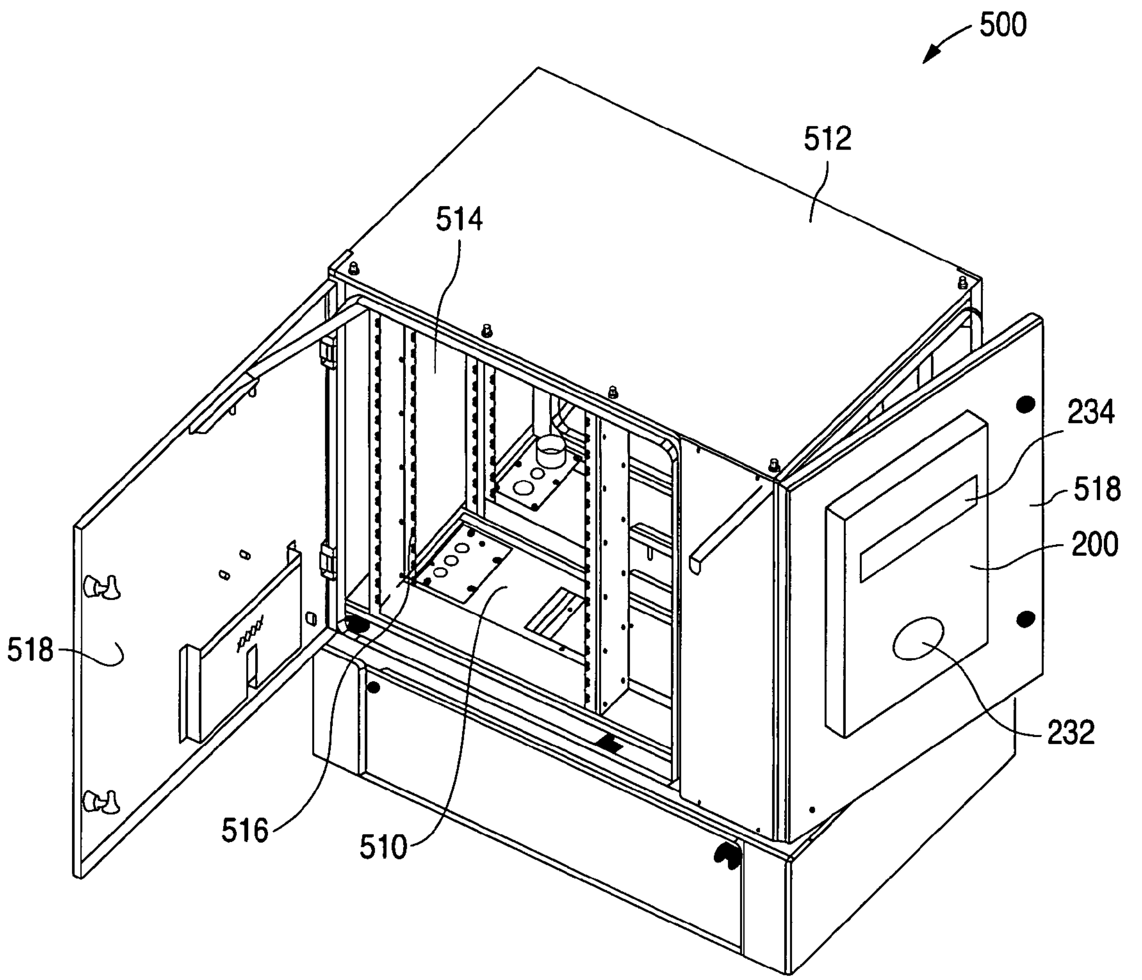
FIG. 5 is a perspective view illustrating an example of a telecommunications cabinet 500 in accordance with the present invention.

FIG. 5 shows a perspective view that illustrates an example of a telecommunications cabinet 500 in accordance with the present invention. As shown in FIG. 5, cabinet 500 includes a base plate 510, a top plate 512, and a number of side walls 514 that are connected to base plate 510 and top plate 512.

In addition, cabinet 500 includes a rack 516 that holds electronic equipment inside of cabinet 500. Further, cabinet 500 includes a number of doors 518 that are connected to the side walls 514 via hinges or other rotational means to provide access to the interior of cabinet 500. As further shown in FIG. 5, heat exchanger 200 can be fabricated as part of a door 518. When the doors 518 are closed, base plate 510, top plate 512, and side walls 514 form an air tight and water tight seal.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A heat exchanger comprising:

an air flow structure that has a top surface, a bottom surface, a width, a length, a first edge that runs along the width, a second edge that runs along the width, a plurality of first grooves in the top surface, and a plurality of second grooves in the bottom surface, the first and second grooves extending along the length between the first and second edges;

a first wall that contacts substantially all of the first edge of the air flow structure, the first wall having a plurality of openings that extend through the first wall such that each opening is surrounded by the first wall, no portion of the first wall extending into the plurality of first grooves, the first wall preventing a fluid in the first grooves from flowing past the first edge, the plurality of openings allowing a fluid in the second grooves to flow past the first edge; and a second wall that contacts substantially all of the second edge of the air flow structure, the second wall having a plurality of openings that extend through the second wall such that each opening in the second wall is surrounded by the second wall, no portion of the second wall extending into the plurality of first grooves, the second wall preventing a fluid in the second grooves from flowing past the second edge, the plurality of openings in the second wall allowing a fluid in the first grooves to flow past the second edge.

2. The heat exchanger of claim 1 wherein the first wall is connected to the first edge via an adhesive.

3. The heat exchanger of claim 1 and further comprising a first plate formed adjacent to the top surface, the first plate contacting the first wall, the first plate having a first opening and a second opening spaced apart from the first opening, the first opening exposing portions of the first grooves.

4. The heat exchanger of claim 3 wherein the first plate contacts the top surface.

5. The heat exchanger of claim 2 wherein the second wall is connected to the second edge via an adhesive.

6. The heat exchanger of claim 3 and further comprising a second plate formed adjacent to the bottom surface, the second plate contacting the second wall, the second plate having a third opening and a fourth opening spaced apart from the third opening, the third opening exposing portions of the second grooves.

7. The heat exchanger of claim 6 wherein the second plate contacts the bottom surface.

8. The heat exchanger of claim 6 wherein the second plate includes a base section and sidewalls that extend perpendicularly away from the base section.

9. The heat exchanger of claim 8 and further comprising a first air flow generator connected to the second plate adjacent to the second opening, the first air flow generator causing air to follow a path through the first opening along the first grooves and through the second opening.

10. The heat exchanger of claim 8 and further comprising a first air flow generator connected to the first plate adjacent to the second opening, the first air flow generator causing air to follow a path through the first opening along the first grooves and through the second opening.

11. The heat exchanger of claim 9 and further comprising a second air flow generator connected to the first plate adjacent to the fourth opening, the second air flow generator causing air to follow a path through the third opening along the second grooves and through the fourth opening.

12. The heat exchanger of claim 9 and further comprising a second air flow generator connected to the second plate adjacent to the fourth opening, the second air flow generator causing air to follow a path through the third opening along the second grooves and through the fourth opening.

13. The heat exchanger of claim 1 wherein a first groove and a second groove share a section of the structure.

14. The heat exchanger of claim 1 wherein the first wall includes plastic.

15. The heat exchanger of claim 14 wherein the second wall includes plastic.

16. A method of forming a heat exchanger, the method comprising:

forming an air flow structure that has a top surface, a bottom surface, a width, a length, a first edge that runs along the width, a second edge that runs along the width, a plurality of first grooves in the top surface, and a plurality of second grooves in the bottom surface, the first and second grooves extending along the length between the first and second edges, each groove having a substantially uniform width from the first edge to the second edge; and forming a first wall that contacts substantially all of the first edge of the air flow structure, the first wall having a plurality of openings that extend through the first wall such that each opening is surrounded by the first wall, no portion of the first wall extending into the plurality of first grooves, the first wall preventing a fluid in the first grooves from flowing past the first edge, the plurality of openings allowing a fluid in the second grooves to flow past the first edge; and connecting the first wall to the first edge of the air flow structure.

17. The method of claim 16 and further comprising:

forming a second wall that contacts substantially all of the second edge of the air flow structure, the second wall having a plurality of openings that extend through the second wall such that each opening in the second wall is surrounded by the second wall, no portion of the second wall extending into the plurality of first grooves, the second wall preventing a fluid in the second grooves from flowing past the second edge, the plurality of openings in the second wall allowing a fluid in the first grooves to flow past the second edge; and connecting the second wall to the second edge of the air flow structure.

18. The method of claim 16 wherein the first wall is adhesively connected to the air flow structure.

19. The method of claim 17 wherein the second wall is adhesively connected to the air flow structure.

* * * * *